United States Patent
Kang et al.

(10) Patent No.: US 8,901,008 B2
(45) Date of Patent: Dec. 2, 2014

(54) SUBSTRATE PLASMA-PROCESSING APPARATUS

(71) Applicant: Samsung Display Co., Ltd., Yongin (KR)

(72) Inventors: Tae-Wook Kang, Yongin (KR);
Ou-Hyen Kim, Yongin (KR);
Chang-Soon Ji, Yongin (KR);
Hyun-Lae Cho, Yongin (KR);
Cheng-Guo An, Yongin (KR);
Jeong-Yeol Lee, Yongin (KR);
Jae-Mork Park, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 11 days.

(21) Appl. No.: 13/972,497

(22) Filed: Aug. 21, 2013

(65) Prior Publication Data

US 2013/0337605 A1   Dec. 19, 2013

Related U.S. Application Data

(63) Continuation of application No. 12/774,846, filed on May 6, 2010, now abandoned.

(30) Foreign Application Priority Data

May 7, 2009 (KR) .................. 10-2009-0039887

(51) Int. Cl.
*H01L 21/302* (2006.01)

(52) U.S. Cl.
USPC ....... 438/729; 438/716; 438/725; 156/345.47

(58) Field of Classification Search
USPC ......... 438/706, 710, 712, 714, 716, 729, 715; 156/345.19, 345.23, 345.29, 345.47
See application file for complete search history.

(56) References Cited

U.S. PATENT DOCUMENTS

| | | | |
|---|---|---|---|
| 5,670,066 | A | 9/1997 | Barnes et al. |
| 5,855,679 | A * | 1/1999 | Ogawa .................. 118/719 |
| 8,161,906 | B2 | 4/2012 | Kadkhodayan et al. |
| 2001/0018272 | A1 * | 8/2001 | Haji et al. ............ 438/710 |
| 2006/0078677 | A1 * | 4/2006 | Won et al. ............ 427/248.1 |
| 2007/0091541 | A1 | 4/2007 | Buchberger et al. |
| 2008/0311313 | A1 * | 12/2008 | Kobayashi et al. .......... 427/577 |

FOREIGN PATENT DOCUMENTS

| | | |
|---|---|---|
| JP | 01-279783 | 11/1989 |
| KR | 10-2008-0013552 | 2/2008 |
| KR | 10-2008-0020722 | 3/2008 |
| KR | 10-2008-0061811 | 7/2008 |

OTHER PUBLICATIONS

Non-Final Office Action issued on Nov. 6, 2012 in U.S. Appl. No. 12/774,846.
Final Office Action issued on May 21, 2013 in U.S. Appl. No. 12/774,846.
Office Action issued on Nov. 8, 2010 by the Korean Industrial Property Office in Korean Patent Application No. 10-2009-0039887.

* cited by examiner

*Primary Examiner* — Lan Vinh
(74) *Attorney, Agent, or Firm* — H.C. Park & Associates, PLC

(57) ABSTRACT

A substrate plasma-processing apparatus for plasma-processing a surface of an electrode of an organic light emitting device. The substrate plasma-processing apparatus may adjust the distance between a first electrode and a substrate and adjust the distance between a second electrode and the substrate.

20 Claims, 3 Drawing Sheets

SUBSTRATE PLASMA-PROCESSING APPARATUS

CROSS-REFERENCE TO RELATED APPLICATIONS

This application is a continuation of U.S. patent application Ser. No. 12/774,846, filed on May 6, 2010, and claims priority from and the benefit of Korean Patent Application No. 10-2009-0039887, filed on May 7, 2009 in the Korean Intellectual Property Office, both of which are hereby incorporated by reference for all purpose as if fully set forth herein.

BACKGROUND OF THE INVENTION

1. Field

Aspects of the present invention relate to a substrate plasma-processing apparatus.

2. Discussion of the Background

An organic light emitting display device using an organic light emitting device (OLED) has a fast response speed compared to a liquid crystal (LCD) typical of those currently widely used. Organic light emitting display devices are being thought of as the next generation display device because an organic light emitting display device accommodates a moving picture better, has a wider viewing angle due to self light-emission, and exhibits high brightness.

The OLED includes a pixel electrode, a counter electrode facing the pixel electrode, and an emission layer including an organic material where the emission layer is interposed between the pixel electrode and the counter electrode. Before depositing the organic material, a surface of the pixel electrode (i.e., an anode electrode) is processed using plasma. The plasma-process with respect to the surface of the pixel electrode has an effect on light emission efficiency and lifetime of the OLED. That is, if the surface of the pixel electrode is not uniformly plasma-processed, the brightness of the organic light emitting display device is not uniform and also, the lifetime of the organic light emitting display device is shortened. Therefore, with respect to plasma-processing the surface of the pixel electrode, plasma uniformity in a plasma-processing apparatus is very important.

SUMMARY

Aspects of the present invention provide a substrate plasma-processing apparatus for constantly maintaining plasma uniformity in a chamber. An aspect of the present invention provides a substrate plasma-processing apparatus for plasma-processing the surface of a pixel or other display electrode formed on a substrate, the substrate plasma-processing apparatus including a chamber having disposed therein the substrate; a first electrode disposed in the chamber apart from the bottom surface of the substrate; a second electrode disposed in the chamber apart from the top surface of the substrate; and a distance adjusting unit adjusting the distance between the first electrode and the substrate or the distance between the second electrode and the substrate.

According to an aspect of the invention, the distance adjusting unit may adjust the distance between the first electrode and the substrate by raising or lowering the substrate.

According to an aspect of the invention, the distance adjusting unit may adjust the distance between the second electrode and the substrate by raising or lowering the second electrode.

Another aspect of the present invention provides a substrate plasma-processing apparatus for plasma-processing the surface of a pixel or other display electrode of an organic light emitting device, the substrate plasma-processing apparatus including a chamber; a distance adjusting unit for supporting and moving the substrate in the chamber; a first electrode disposed below and apart from the substrate; and a second electrode facing the first electrode by being disposed above and apart from the substrate; wherein the distance adjusting unit adjusts the distance between the substrate and the first electrode or the distance between the substrate and the second electrode.

According to an aspect of the invention, the distance adjusting unit may include a substrate supporting unit supporting the substrate; a supporting bar coupled with the substrate supporting unit in a direction perpendicular to the substrate; and an actuator vertically raising or lowering the supporting bar.

According to an aspect of the invention, the actuator may increase the distance between the substrate and the first electrode by moving the supporting bar outside the chamber.

According to an aspect of the invention, the actuator may decrease the distance between the substrate and the first electrode by moving the supporting bar inside the chamber.

According to an aspect of the invention, the second electrode may be supported by the supporting bar and may be disposed above and apart from the substrate.

According to an aspect of the invention, the distance between the substrate and the second electrode may be maintained constant while the substrate is raised or lowered.

According to an aspect of the invention, the second electrode may be fixed to the supporting bar.

According to an aspect of the invention, when the substrate is raised, the distance between the substrate and the first electrode may increase and the distance between the substrate and the second electrode may decrease.

According to an aspect of the invention, when the substrate is lowered, the distance between the substrate and the first electrode may decrease and the distance between the substrate and the second electrode may increase.

According to an aspect of the invention, the substrate supporting unit and the supporting bar may be formed of an insulating material.

According to an aspect of the invention, the substrate supporting unit and the supporting bar may be formed of a ceramic material.

According to an aspect of the invention, the ceramic may include alumina ($Al_2O_3$).

According to an aspect of the invention, the substrate plasma-processing apparatus may further include a first insulating member disposed between the substrate supporting unit and the supporting bar, and the first insulating member may couple the substrate supporting unit and the supporting bar.

According to an aspect of the invention, the substrate plasma-processing apparatus may further include a first cover unit externally surrounding the first insulating member.

According to an aspect of the invention, the first cover unit may be formed of ceramic. The first insulating member may be formed of a polymer.

According to an aspect of the invention, the substrate supporting unit and the supporting bar may be formed of a metal.

According to an aspect of the invention, the substrate plasma-processing apparatus may further include a second insulating member disposed between the first electrode and the chamber.

According to an aspect of the invention, the second insulating member may be formed of a fluoropolymer.

According to an aspect of the invention, the second electrode may be grounded.

According to an aspect of the invention, the may flow in the second electrode so as to maintain a temperature of the second electrode constant.

According to an aspect of the invention, the first electrode may include at least one pipe for delivering gas from outside of the chamber; and at least one shower head for emitting the gas to the chamber.

According to an aspect of the invention, the substrate plasma-processing apparatus may further include at least one flow adjusting valve for adjusting the flow of the gas emitted to the first electrode.

According to an aspect of the invention, the substrate plasma-processing apparatus may further include an inner chamber disposed in the chamber, and the first electrode may be disposed in the inner chamber.

According to an aspect of the invention, the substrate plasma-processing apparatus may further include a third insulating member disposed between the inner chamber and the chamber.

According to an aspect of the invention, the third insulating member may be formed of a fluoropolymer.

According to an aspect of the invention, the substrate plasma-processing apparatus may further include a second cover unit externally surrounding the third insulating member.

According to an aspect of the invention, the second cover unit may be formed of a ceramic material.

Additional aspects and/or advantages of the invention will be set forth in part in the description which follows and, in part, will be obvious from the description, or may be learned by practice of the invention.

BRIEF DESCRIPTION OF THE DRAWINGS

Aspects and advantages of the invention will become apparent and more readily appreciated from the following description of the embodiments, taken in conjunction with the accompanying drawings of which.

DETAILED DESCRIPTION OF THE ILLUSTRATED EMBODIMENTS

Figure 1:
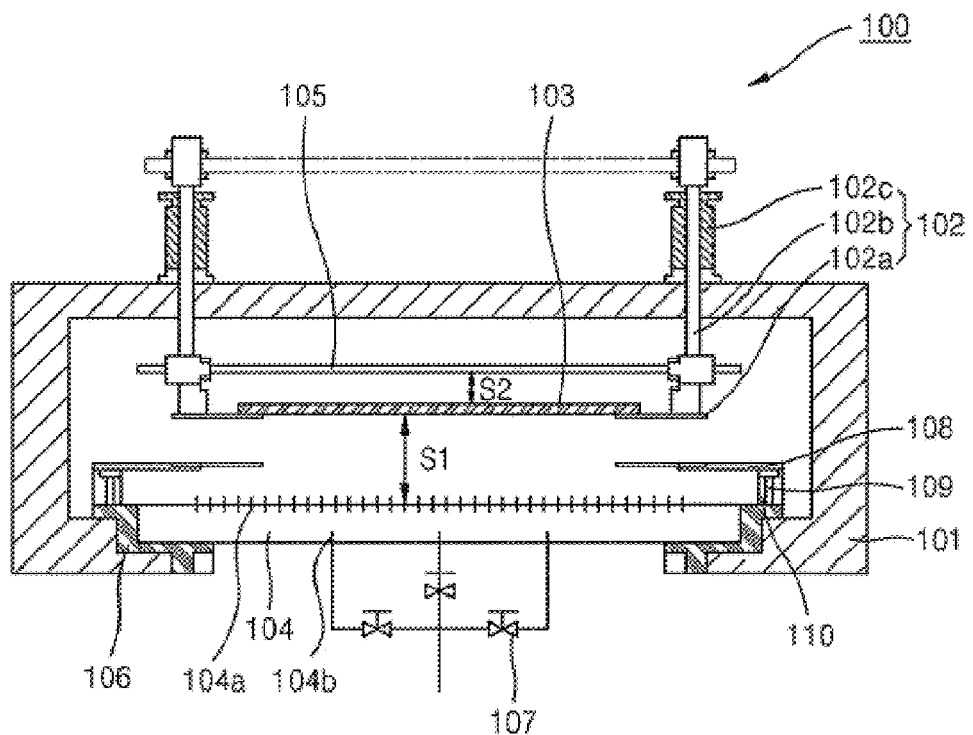
FIG. 1 is a cross-sectional view of a substrate plasma-processing apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a cross-sectional view of a substrate plasma-processing apparatus 100 according to an embodiment of the present invention. Referring to FIG. 1, the substrate plasma-processing apparatus 100 includes a chamber 101, a distance adjusting unit 102, a first electrode 104, a second electrode 105, and at least one flow adjusting valve 107.

The distance adjusting unit 102 is disposed in the chamber 101 to support a substrate 103 and the second electrode 105. The distance adjusting unit 102 supports the substrate 103 and the second electrode 105, raises or lowers the substrate 103 in the chamber 101, and raises or lowers the second electrode 105 in the chamber 101. The second electrode 105 is disposed above and apart from the substrate 103, and the first electrode 104 is disposed below and apart from the substrate 103. Thus, when the distance adjusting unit 102 raises or lowers the substrate 103, the distance S1 between the first electrode 104 and the substrate 103, and the distance S2 between the second electrode 105 and the substrate 103 may be adjusted, or when the distance adjusting unit 102 raises or lowers the second electrode 105, the distance S2 between the second electrode 105 and the substrate 103 may be adjusted. A detailed description thereof will be provided later.

While not required in all aspects, the shown distance adjusting unit 102 includes a substrate supporting unit 102a, a supporting bar 102b, and an actuator 102c. The shown substrate supporting unit 102a supports the bottom surface of the substrate 103. The shown substrate supporting unit 102a is formed of two plates which are individually connected to the supporting bar 102b. The two plates of the substrate supporting unit 102a are disposed apart from each other sufficiently so that the substrate 103 is disposed between the two plates. The shown two plates of the substrate supporting unit 102a support bottom surfaces of both side portions of the substrate 103, wherein the side portions face each other. That is, the substrate 103 is disposed between the two plates of the substrate supporting unit 102a so that the bottom surface of the substrate 103 faces the first electrode 104, and the top surface of the substrate 103 faces the second electrode 105. However, it is understood that the supporting unit 102a can be otherwise constructed, and can support other sides of the substrate in addition to, or instead of the sides shown.

An end of the supporting bar 102b is coupled with the substrate supporting unit 102a, and a portion of the supporting bar 102b is in the chamber 101. Thus, the substrate supporting unit 102a is disposed in the chamber 101. Referring to FIG. 1, the end of the supporting bar 102b is coupled with the substrate supporting unit 102a in the direction perpendicular to the substrate 103, and the other end is connected to the actuator 102c disposed outside the chamber 101. That is, the portion of the supporting bar 102b is disposed inside the chamber 101, and another portion of the supporting bar 102b is disposed outside the chamber 101, in such a manner that the substrate supporting unit 102a and the portion of the supporting bar 102b are disposed in the chamber 101.

While not required in all aspects, the shown supporting bar 102b is vertically raised or lowered by the actuator 102c. Since the end of the supporting bar 102b is coupled with the substrate supporting unit 102a, the substrate supporting unit 102a is raised or lowered when the supporting bar 102b is raised or lowered. Thus, according to the raising or the lowering of the supporting bar 102b, the substrate 103 supported by the substrate supporting unit 102a is raised or lowered.

The actuator 102c vertically raises or lowers the supporting bar 102b. As illustrated in FIG. 1, the actuator 102c is disposed outside the chamber 101. In this case, the actuator 102c is connected to the other portion of the supporting bar 102b, which is outside the chamber 101. However, the position of the actuator 102c of the substrate plasma-processing apparatus 100 is not limited to the aforementioned position, and thus, the actuator 102c may be disposed inside the chamber 101 and connected at other portions of the supporting bar 102b.

When the actuator 102c raises the supporting bar 102b, the supporting bar 102b moves in the direction toward the outside of the chamber 101 so that the substrate supporting unit 102a which is coupled with the end of the supporting bar 102b is also raised. Thus, the substrate 103, which is supported by the substrate supporting unit 102a, is raised inside the chamber 101. Accordingly, the distance S1 between the first electrode 104 and the substrate 103 increases. Conversely, when the actuator 102c lowers the supporting bar 102b, the supporting bar 102b moves in the direction toward the inside the chamber 101 so that the substrate supporting unit 102a which is coupled with the end of the supporting bar 102b is also lowered. Thus, the substrate 103, which is supported by the substrate supporting unit 102a, is lowered inside the chamber 101. Accordingly, the distance S1 between the first electrode 104 and the substrate 103 decreases.

The substrate supporting unit 102a and the supporting bar 102b are formed of an insulating material such as a ceramic. The ceramic may be alumina ($Al_2O_3$). In this manner, the substrate supporting unit 102a and the supporting bar 102b are formed of the insulating material so that it is possible to prevent arcing from occurring between the substrate 103 and the substrate supporting unit 102a, or between the supporting bar 102b and the substrate supporting unit 102a.

Figure 2:
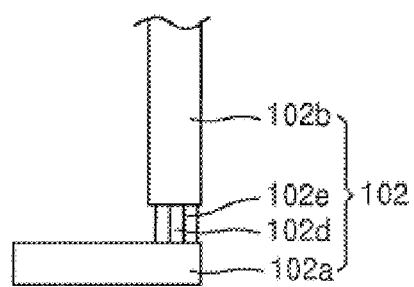
FIG. 2 is a variation of a distance adjusting unit of the substrate plasma-processing apparatus of FIG. 1.

As a modified embodiment, a first insulating member 102d (see FIG. 2) may be disposed between the substrate supporting unit 102a and the supporting bar 102b. FIG. 2 is a diagram of the distance adjusting unit 102 of the substrate plasma-processing apparatus of FIG. 1. Referring to FIG. 2, the substrate supporting unit 102a and the supporting bar 102b are coupled by a first insulating member 102d. The first insulating member 102d is a polymer, for example a fluoropolymer. A first cover unit 102e is disposed to externally surround the first insulating member 102d. The first cover unit 102e protects the first insulating member 102d from plasma. The substrate supporting unit 102a and the supporting bar 102b are formed of a metal such as aluminum. The first insulating member 102d prevents arcing from occurring between the substrate supporting unit 102a and the supporting bar 102b.

Referring back to FIG. 1, the first electrode 104 is disposed inside the chamber 101 apart from the bottom surface of the substrate 103. The first electrode 104 is a radio frequency (RF) electrode to which radio frequency (RF) power is applied. An RF power of about 40 Mhz may be applied to the first electrode 104.

A surface of the first electrode 104 faces the inside of the chamber 101, and the other surface of the first electrode 104 faces the outside of the chamber 101. At least one shower head 104a for emitting a gas to the chamber 101 is disposed on the surface of the first electrode 104, which faces the inside of the chamber 101. At least one pipe 104b for delivering a gas from the outside of the chamber 101 to the inside of the chamber 101 is disposed on the other surface of the first electrode 104, which faces the outside of the chamber 101. A gas such as $N_2$, $O_2$, He, Ar, or the like is injected into the first electrode 104. Then, the gas is emitted to the inside of the chamber 101 via the at least one shower head 104a of the first electrode 104.

The substrate plasma-processing apparatus 100 further includes at least one flow adjusting valve 107. Each flow adjusting valve 107 is disposed on one pipe 104b and adjusts the flow of the gas emitted to the first electrode 104.

A second insulating member 106 is disposed between the first electrode 104 and the chamber 101. The second insulating member 106 prevents direct contact between the first electrode 104 and the chamber 101. That is, the second insulating member 106 is disposed at side and bottom portions of the first electrode 104 which may contact the chamber 101. In this way, the first electrode 104 and the chamber 101 do not directly contact each other. Thus, using the second insulating member 106, the first electrode 104 and the chamber 101 are insulated from each other so that it is possible to prevent arcing from occurring between the first electrode 104 and the chamber 101. The second insulating member 106 may be formed of a fluoropolymer.

An inner chamber 108 is disposed in the chamber 101. As shown in FIG. 1, the first electrode 104 is disposed in the inner chamber 108. The top portion of the inner chamber 108 is open.

A third insulating member 109 is disposed between the inner chamber 108 and the chamber 101. The third insulating member 109 prevents the inner chamber 108 from directly contacting the chamber 101. By the third insulating member 109, the chamber 101 and the inner chamber 108 are insulated from each other, and it is possible to prevent arcing from occurring between the chamber 101 and the inner chamber 108. The third insulating member 109 may be formed of a fluoropolymer. A second cover unit 110 externally surrounds the third insulating member 109. The second cover unit 110, covering the third insulating member 109, prevents the third insulating member 109 from being directly exposed to plasma. The second cover unit 110 may be formed of a ceramic material.

The second electrode 105 faces the first electrode 104 by being disposed above and apart from the substrate 103. The second electrode 105 is disposed in the chamber 101 while being supported by the supporting bar 102b of the distance adjusting unit 102 that supports the substrate 103.

The second electrode 105 is disposed above and apart from the substrate 103 by being slidably fixed to the supporting bar 102b. In this manner, in the case where the second electrode 105 is slidably fixed to the supporting bar 102b, when the substrate 103 is raised or lowered by the distance adjusting unit 102, the distance S2 between the substrate 103 and the second electrode 105 may increase or decrease while maintaining a constant distance of either the substrate 103 or the second electrode 105 relative to the chamber 101.

To be more specific, since the second electrode 105 is slidably fixed to the supporting bar 102b, when the substrate 103 is raised, the distance S2 between the substrate 103 and the second electrode 105 decreases and the distance S1 between the substrate 103 and the first electrode 104 increases. Also, when the substrate 103 is lowered, the distance S2 between the substrate 103 and the second electrode 105 increases, and the distance S1 between the substrate 103 and the first electrode 104 decreases. While not required in all aspects, the second electrode 105 can be slidably fixed to the supporting bar 102b while being fixed to the chamber 101, and/or the second electrode 105 can be fixed to the supporting bar 102b using a clamp, which can be loosened to allow adjustment of the distance S2 and tightened to prevent further adjustment. However, the invention is not limited thereto.

As another modified embodiment, the second electrode 105 may be disposed at the supporting bar 102b so as to maintain a constant distance from the substrate 103 (i.e., not slidably fixed). In this case, the substrate 103 and the second electrode 105 are raised or lowered while maintaining the constant distance. Thus, when the substrate 103 is raised or lowered, the distance S1 between the substrate 103 and the first electrode 104 increases or decreases but the distance between the substrate 103 and the second electrode 105 is constant. In the case where the distance between the substrate 103 and the second electrode 105 has to be changed when the distance between the substrate 103 and the second electrode 105 is constantly maintained, the second electrode 105 may be separated from the supporting bar 102b, the distance between the substrate 103 and the second electrode 105 may be adjusted, and then, the second electrode 105 may be disposed at the supporting bar 102b.

As another modified embodiment, the second electrode 105 may be moved by the distance adjusting unit 102. That is, the distance adjusting unit 102 may adjust the distance S2 between the second electrode 105 and the substrate 103 by raising or lowering the second electrode 105. In this case, the distance adjusting unit 102 adjusts the distance S1 between the first electrode 104 and the substrate 103 by raising or lowering the substrate 103 with respect to the first electrode 104, and adjusts the distance S2 between the substrate 103 and the second electrode 105 by raising or lowering the second electrode 105 with respect to the substrate 103 that is fixed.

The second electrode 105 is grounded. The second electrode 105 may have an internal space in which refrigerant flows. Since the refrigerant flows in the second electrode 105, it is possible to prevent the second electrode 105 from being overheated and to maintain the temperature of the second electrode 105 constant.

As described above, by adjusting the distance S1 between the substrate 103 and the first electrode 104 that is the RF electrode, plasma uniformity is improved by adjusting the plasma status in the chamber 101. Accordingly, the surface of an anode electrode (not shown) on the substrate 103 is uniformly etched so that it is possible to prevent the brightness of an organic light emitting display device from being degraded and to increase the yield rate.

Figure 3A:
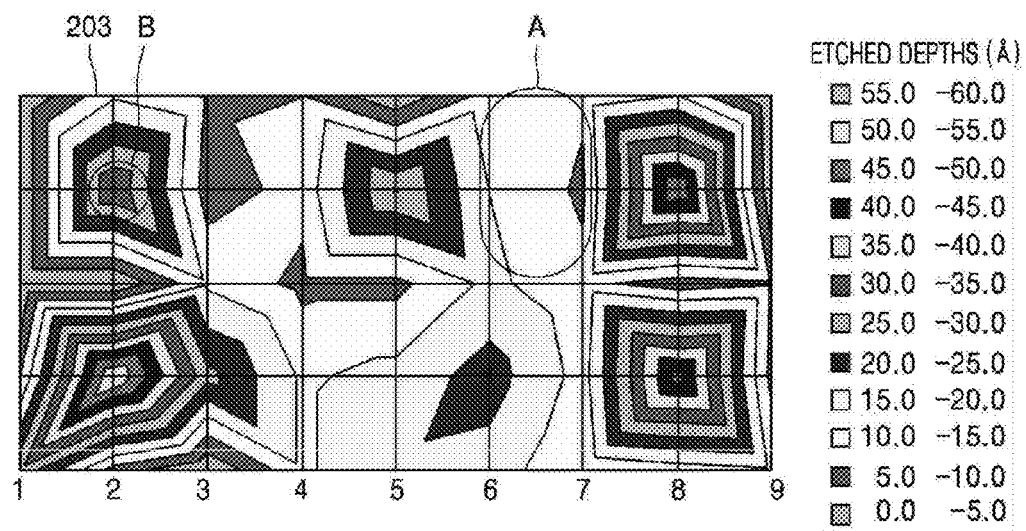
FIG. 3A is a two-dimensional etching map with respect to etching degree of a mother substrate that is plasma-processed by a conventional plasma-processing apparatus.
Figure 3B:
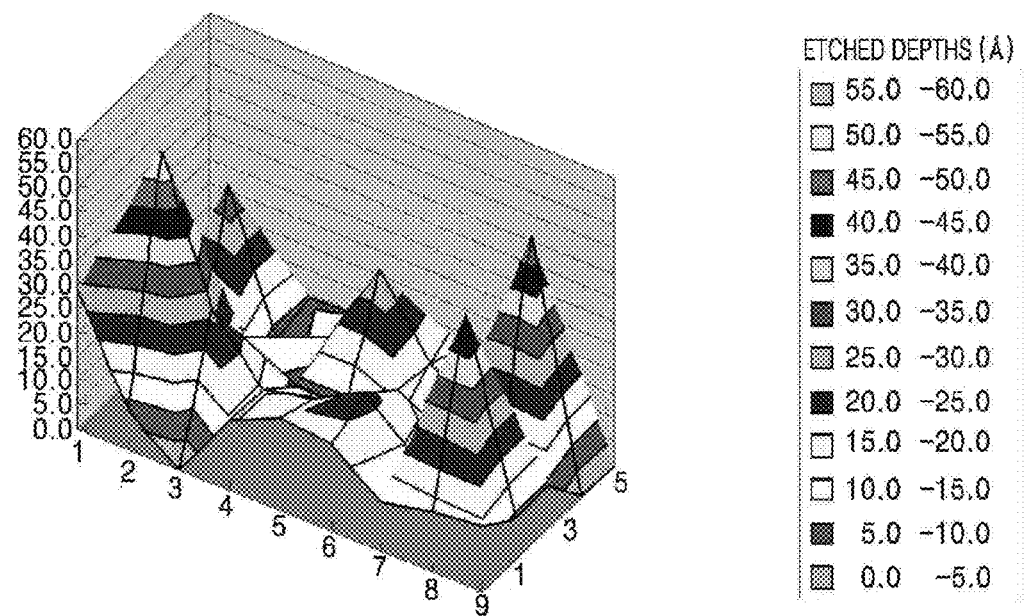
FIG. 3B is a three-dimensional etching map with respect to etching degree of a mother substrate that is plasma-processed by a conventional plasma-processing apparatus.

FIGS. 3A and 3B illustrate etching maps with respect to etching degree of a mother substrate 203 that is plasma-processed by a conventional plasma-processing apparatus. In more detail, the etching map of FIG. 3A is a two-dimensional etching map, and the etching map of FIG. 3B is a three-dimensional etching map.

Referring to the etching map of FIG. 3A, it is apparent that the portion A of the surface of the mother substrate 203 is deeply etched but another portion B is shallowly etched so that etching is not uniform. Brightness is relatively degraded at the deeply etched portion A, compared to the shallowly etched portion B. Also, a significantly and shallowly etched portion has a degraded lifetime.

Figure 4A:
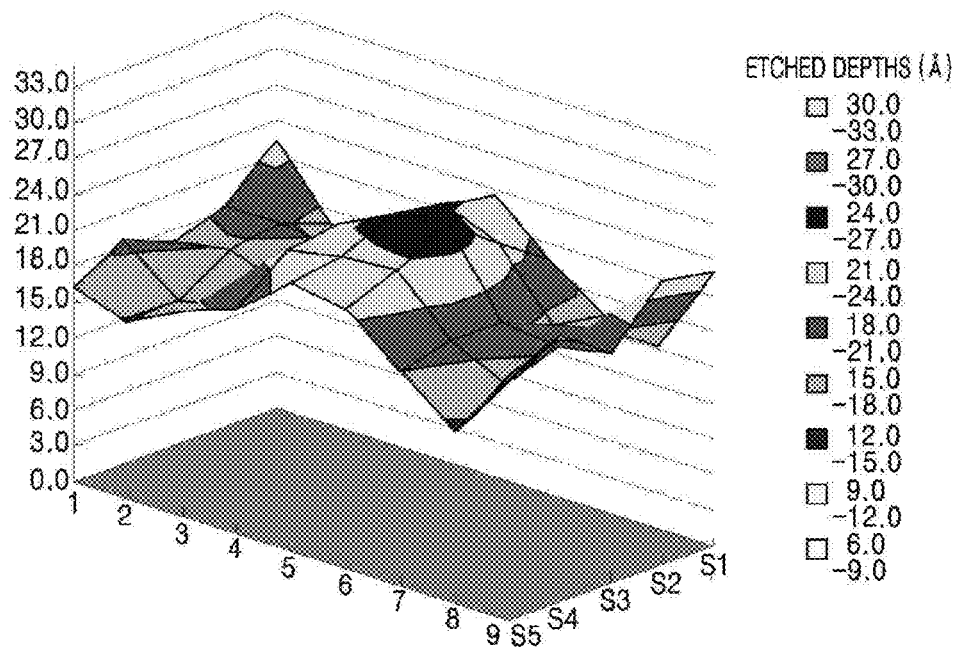
FIG. 4A is a two-dimensional etching map with respect to etching degree of a mother substrate that is plasma-processed by the substrate plasma-processing apparatus according to an embodiment of the present invention.
Figure 4B:
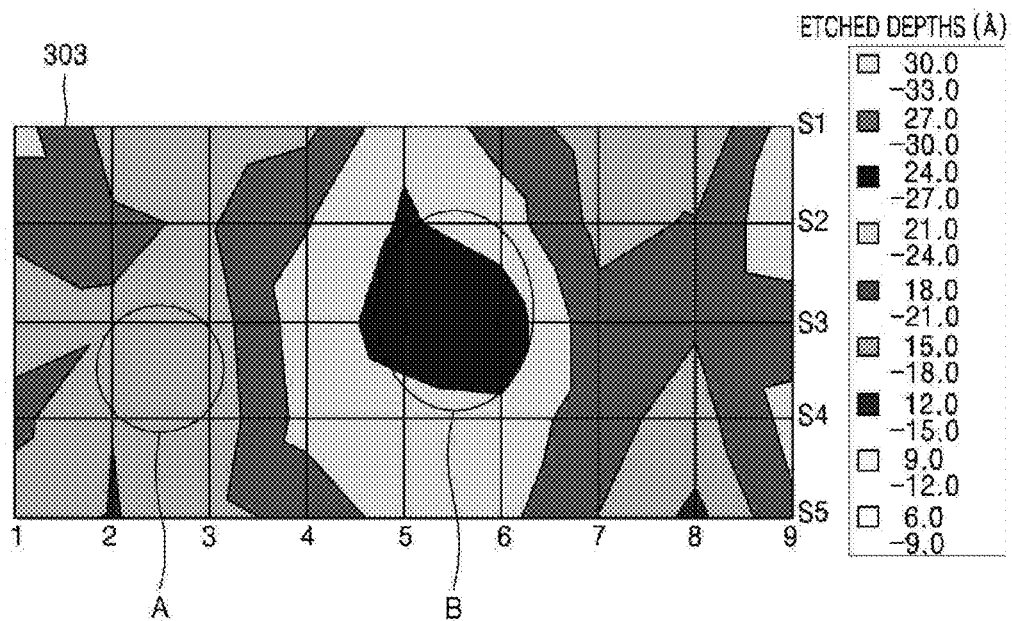
FIG. 4B is a three-dimensional etching map with respect to etching degree of a mother substrate that is plasma-processed by the substrate plasma-processing apparatus according to the embodiment of FIG. 4A.

FIGS. 4A and 4B illustrate etching maps with respect to etching degree of a mother substrate 303 that is plasma-processed by the substrate plasma-processing apparatus 100 according to the embodiment of FIG. 1. In more detail, the etching map of FIG. 4A is a two-dimensional etching map, and the etching map of FIG. 4B is a three-dimensional etching map.

Referring to the etching maps of FIG. 4A, it is apparent that the surface of the mother substrate 303 is uniformly etched. That is, there is a small difference between the rather deeply etched portion A and the rather shallowly etched portion B, and the whole surface of the mother substrate 303 is uniformly etched. In this manner, since uniform etching is performed on the mother substrate 303, problems including brightness degradation and lifetime reduction of the organic light emitting display device may be solved.

According to embodiments of the present invention, the etching in the surface of the substrate is made uniform by maintaining plasma uniformity in the chamber constant, so that the problems including brightness degradation and lifetime reduction of the organic light emitting display device are solved.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method for manufacturing an organic light-emitting display apparatus, the method comprising:
   placing a substrate containing a display electrode in a plasma-processing chamber between a first electrode and a second electrode such that the first electrode within the chamber is disposed a first distance below and apart from the substrate and the second electrode within the chamber is disposed a second distance above and apart from the substrate, the substrate being supported by a distance adjusting unit, the distance adjusting unit coupling the second electrode to the substrate;
   adjusting at least one of the first distance between the substrate and the first electrode and the second distance between the substrate and the second electrode; and
   performing plasma-processing while the substrate is disposed at the adjusted at least one of the first distance and second distance, the first electrode and the second electrode not contacting the substrate during plasma-processing.

2. The method of claim 1, wherein the second electrode is grounded.

3. The method of claim 1, wherein refrigerant flows in the second electrode to maintain a temperature of the second electrode.

4. The method of claim 1, further comprising emitting a gas to the chamber through at least one shower head, the gas being delivered by at least one pipe.

5. The method of claim 4, wherein a flow of the emitted gas is adjusted by at least one flow adjusting valve.

6. The method of claim 1, wherein the first electrode is disposed in an inner chamber, the inner chamber being disposed in the chamber.

7. The method of claim 6, wherein a third insulating member is disposed between the inner chamber and the chamber.

8. The method of claim 7, wherein a second cover unit externally surrounds the third insulating member.

9. The method of claim 8, wherein the second cover unit comprises a ceramic material.

10. The method of claim 1, wherein the distance adjusting unit comprises:
    a substrate supporting unit to support the substrate;
    a supporting bar coupled with the substrate supporting unit in a direction perpendicular to the substrate; and
    an actuator to vertically raise or lower the supporting bar.

11. The method of claim 10, wherein the actuator is configured to adjust the first distance between the substrate and the first electrode by moving the supporting bar in a direction away from a center of the chamber or by moving the supporting bar toward the center of the chamber.

12. The method of claim 10, wherein the substrate supporting unit and the supporting bar comprise an insulating material.

13. The method of claim 12, wherein the substrate supporting unit and the supporting bar comprise a ceramic material.

14. The method of claim 10, wherein the second electrode is supported by the supporting bar.

15. The method of claim 14, wherein the second distance between the substrate and the second electrode is maintained constant while the substrate is raised or lowered.

16. The method of claim 14, wherein, when the substrate is raised, the first distance between the substrate and the first electrode increases and the second distance between the substrate and the second electrode decreases, and wherein, when the substrate is lowered, the first distance between the substrate and the first electrode decreases and the second distance between the substrate and the second electrode increases.

17. The method of claim 10, further comprising:
- a first insulating member disposed between the substrate supporting unit and the supporting bar, wherein the first insulating member couples the substrate supporting unit and the supporting bar; and
- a second insulating member disposed between the first electrode and the chamber.

18. The method of claim 17, wherein the substrate supporting unit and the supporting bar comprise a metal.

19. The method of claim 17, further comprising a first cover unit externally surrounding the first insulating member.

20. The method of claim 19, wherein the first cover unit comprises a ceramic material.

* * * * *